United States Patent
Park

(10) Patent No.: US 6,735,134 B2
(45) Date of Patent: May 11, 2004

(54) SEMICONDUCTOR MEMORY DEVICE AND METHOD FOR DRIVING A SENSE AMPLIFIER

(75) Inventor: San-Ha Park, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 117 days.

(21) Appl. No.: 10/196,172

(22) Filed: Jul. 17, 2002

(65) Prior Publication Data

US 2003/0058722 A1 Mar. 27, 2003

(30) Foreign Application Priority Data

Sep. 24, 2001 (KR) ......................................... 2001-58974

(51) Int. Cl.⁷ ................................................. G11C 7/00
(52) U.S. Cl. ................... 365/205; 365/206; 365/189.11
(58) Field of Search ................................ 365/205, 206, 365/189.11

(56) References Cited

U.S. PATENT DOCUMENTS

| 4,679,172 A | 7/1987 | Kirsch et al. |
| 5,499,218 A | 3/1996 | Ahn et al. |
| 6,337,824 B1 * | 1/2002 | Kono et al. ................. 365/207 |

FOREIGN PATENT DOCUMENTS

| JP | 04-216392 | 8/1992 | ......... G11C/11/401 |
| JP | 08-190791 | 7/1996 | ......... G11C/11/409 |
| JP | 10-255470 | 9/1998 | ......... G11C/11/409 |
| JP | 11-087649 | 3/1999 | ......... H01L/27/108 |
| KR | 2001-7096 | 1/2001 | ......... G11C/11/407 |

* cited by examiner

Primary Examiner—Huan Hoang
Assistant Examiner—Tu-Tu Ho
(74) Attorney, Agent, or Firm—Jacobson Holman PLLC

(57) ABSTRACT

A semiconductor memory device employing a BSG circuit to thereby improve a sensing speed by additionally securing an operational voltage of a sense amplifier in a low voltage operation. The semiconductor memory device includes a sense amplifier for amplifying memory cell data, a sense amplifier driving unit for driving a pull-up source line and a pull-down source line of the sense amplifier and sequentially driving the pull-down source line into a ground voltage and a boosted ground voltage in response to a first control signal and a second control signal, a sense amplifier driving control unit for generating the first and the second control signals and setting a ground voltage driving time of the pull-down source line by adjusting timing of the first control signal, and a boosted ground voltage generating unit for producing the boosted ground voltage.

12 Claims, 6 Drawing Sheets

SEMICONDUCTOR MEMORY DEVICE AND METHOD FOR DRIVING A SENSE AMPLIFIER

FIELD OF THE INVENTION

The present invention relates to semiconductor memory devices and, more particularly, to a technology for improving latency of a RAS (row address strobe) signal of a semiconductor memory device, such as DRAM, appropriate to a low voltage operation implemented by a BSG (boosted sense ground) circuit technology.

DESCRIPTION OF RELATED ART

An example of the prior art, a semiconductor memory device is described in a Japanese patent application of laid-open No. Bei 11-87,649, which was published on Mar. 30, 1999 and is assigned to Tokkai. The semiconductor memory device of that application includes a memory cell array having a plurality of memory cells arrayed in a grid-shape at crossing points of a multiplicity of word lines and a plurality of bit lines and sense amplifiers for amplifying data stored in the memory cells, a decoder for selecting an arbitrary cell from the memory cell array and an input/output (I/O) control circuit for performing I/O control related to data reading and writing for the memory cell selected by the decoder. In order to sufficiently secure an amount of signals of the bit lines, the sense amplifier employs a BSG circuit and the memory cells are formed on an SOI (silicon-oxide-insulator) substrate. However, this circuit configuration has severe problems in that, as a supply voltage is reduced, the driving voltage of the sense amplifiers decreases in an active mode, so that an operational speed may be delayed or the sensing operation may fail.

Another exemplary circuit configuration of the prior art will be explained herein below.

Referring to FIGS. 5A and 5B, there are illustrated a configuration of a sense amplifier driving unit in accordance with an example of the prior art and a voltage waveform of the sense amplifier driving unit and a corresponding sense amplifier.

When the sense amplifier driving unit is employed, a voltage Vcell0 is coupled to a pull-up source line CSP of the sense amplifier in response to a PSA driving signal $S_{PSA}$ and a ground voltage Vss is provided to a pull-down source line CSN of the sense amplifier in response to a Vss driving signal $S_{Vss}$. That is, in an active mode, a voltage, Vgs, shown in equation EQ. 1 below, is coupled between a gate and a source of an NMOS sense amplifier.

$$Vgs = \frac{Vcell0}{2} \qquad \text{EQ. 1}$$

Referring to FIGS. 6A and 6B, there are depicted a configuration of a sense amplifier driving unit in accordance with another example of the prior art, which employs a BSG technology, and a voltage waveform of the sense amplifier driving unit and a corresponding sense amplifier.

According to the BSG technology, the pull-down source line CSN of the sense amplifier is driven by a voltage Vbsg higher than the ground voltage Vss.

Likewise, when employing the sense amplifier driving unit, a voltage Vcell1 (=Vcell0+Vbsg) is provided to the pull-up source line CSP of the sense amplifier in response to the PSA driving signal $S_{PSA}$ and the boosted ground voltage Vbsg is supplied to the pull-down source line CSN of the sense amplifier in response to a boosted ground voltage Vbsg driving signal $S_{Vbsg}$. Therefore, in an active mode, a voltage, Vgs, described in equation EQ. 2 below, is provided between a gate and a source of an NMOS sense amplifier.

$$Vgs = \frac{Vcell1 - Vbsg}{2} = \frac{Vcell0}{2} \qquad \text{EQ. 2}$$

That is, regardless of employing the BSG circuit, in the active mode, the voltage Vgs coupled between the gate and the source of the NMOS sense amplifier has a constant value Vcell0/2 and, therefore, it is difficult to improve an operational speed under a low supply voltage since it is impossible to sufficiently raise the driving voltage of the sense amplifier.

Further, since the conventional BSG technology uses the voltage $V_{bsg}$ separately generated inside a chip, a problem in stability of the sensing operation may occur due to increased noise in the early sensing operation consuming a lot of current.

SUMMARY OF THE INVENTION

It is, therefore, a primary object of the present invention to provide a semiconductor memory device employing a BSG circuit for improving its sensing speed by additionally securing a driving voltage of a sense amplifier in a low supply voltage operation.

Another object of the present invention is to provide a semiconductor memory device for enhancing stability of its sensing operation by reducing noise generated in the early sensing operation of a sense amplifier.

Still another object of the present invention is to provide a sense amplifier driving method for use in a semiconductor memory device for improving an operational speed and operational stability when a low supply voltage is supplied.

In accordance with an aspect of the present invention, there is provided a semiconductor memory device comprising a sense amplifier for amplifying memory cell data; a sense amplifier driving unit for driving a pull-up source line and a pull-down source line of the sense amplifier and sequentially driving the pull-down source line CSN into a ground voltage and a boosted ground voltage in response to a first control signal and a second control signal; a sense amplifier driving control unit for generating the first control signal and the second control signal and setting a ground voltage driving time of the pull-down source line by adjusting timing of the first control signal; and a boosted ground voltage generating unit for producing the boosted ground voltage.

In accordance with another aspect of the present invention, there is provided a semiconductor memory device comprising a sense amplifier for amplifying memory cell data; a sense amplifier driving means having a first sense amplifier driving line connected to a cell voltage providing sector and a second sense amplifier driving line attached to a ground voltage providing sector and a boosted ground voltage providing sector in parallel; a sense amplifier driving control means for controlling the cell voltage providing sector, the ground voltage providing sector and the boosted ground voltage providing sector; and a boosted ground voltage generating means for producing a boosted ground voltage to thereby provide the boosted ground voltage to the sense amplifier driving means.

In accordance with still another aspect of the present invention, there is provided a method for driving a sense amplifier including a pull-up source line and a pull-down source line, which comprises steps of (a) initially driving the pull-up source line to a ground voltage; and (b) driving the pull-up source line to a boosted ground voltage after performing the step (a), wherein the pull-up source line is driven by a cell voltage.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 1:
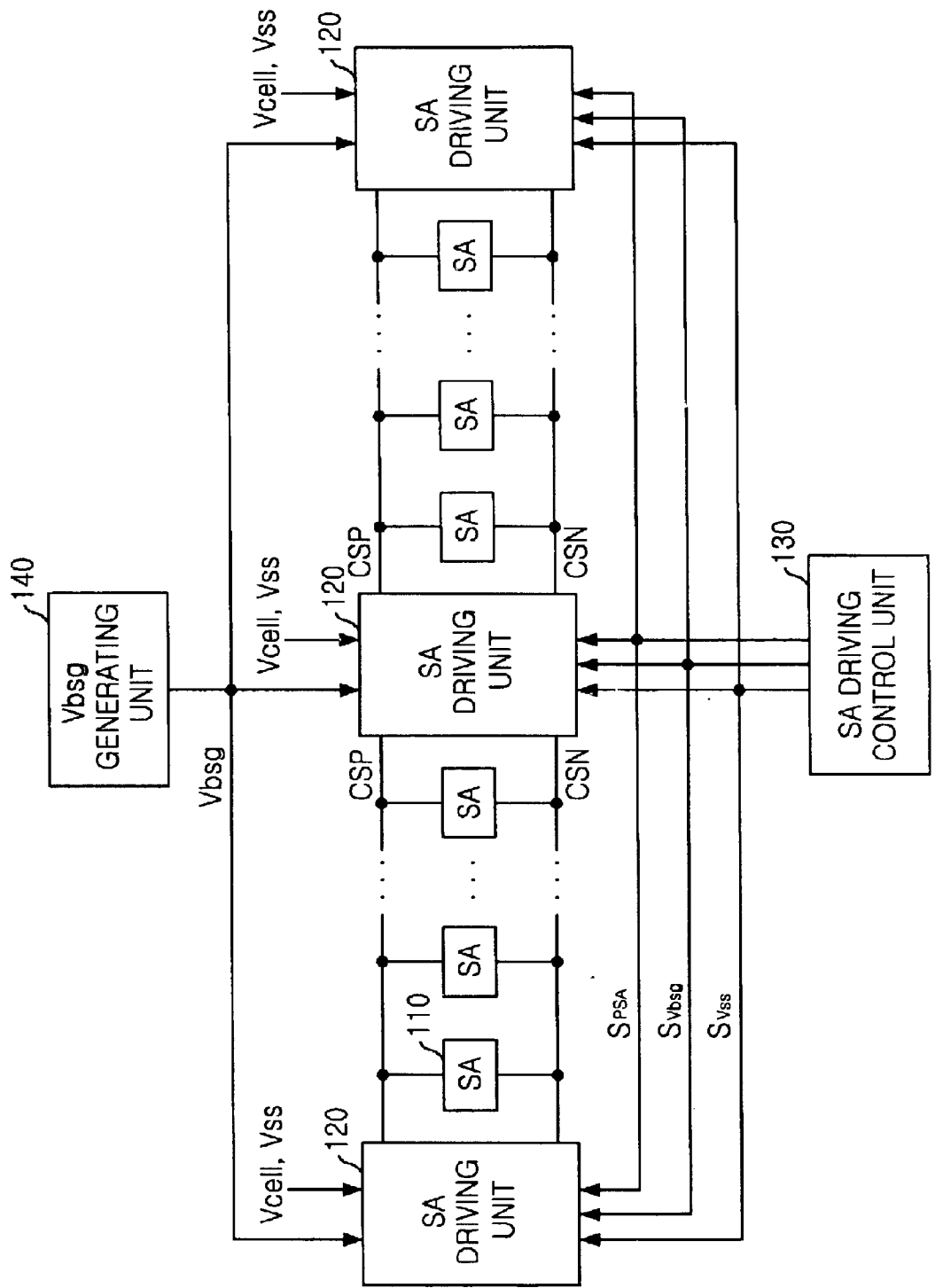
FIG. 1 provides a block diagram of a semiconductor memory device in accordance with the present invention.

Referring to FIG. 1, there is provided a block diagram of a semiconductor memory device in accordance with the present invention.

The semiconductor memory device includes sense amplifiers (SAs) 110 for amplifying data read out of memory cells, SA driving units 120 for driving a pull-up source line CSP and a pull-down source line CSN of the sense amplifiers 110 and selectively providing a ground voltage Vss and a boosted ground voltage Vbsg to the pull-down source line CSN, a SA driving control unit 130 for providing control signals to a plurality of field effect transistors (FETs) in the SA driving units 120, and a boosted ground voltage Vbsg generating unit 140 for producing the boosted ground voltage Vbsg to thereby supply the Vbsg to the SA driving units 120.

Figure 2:
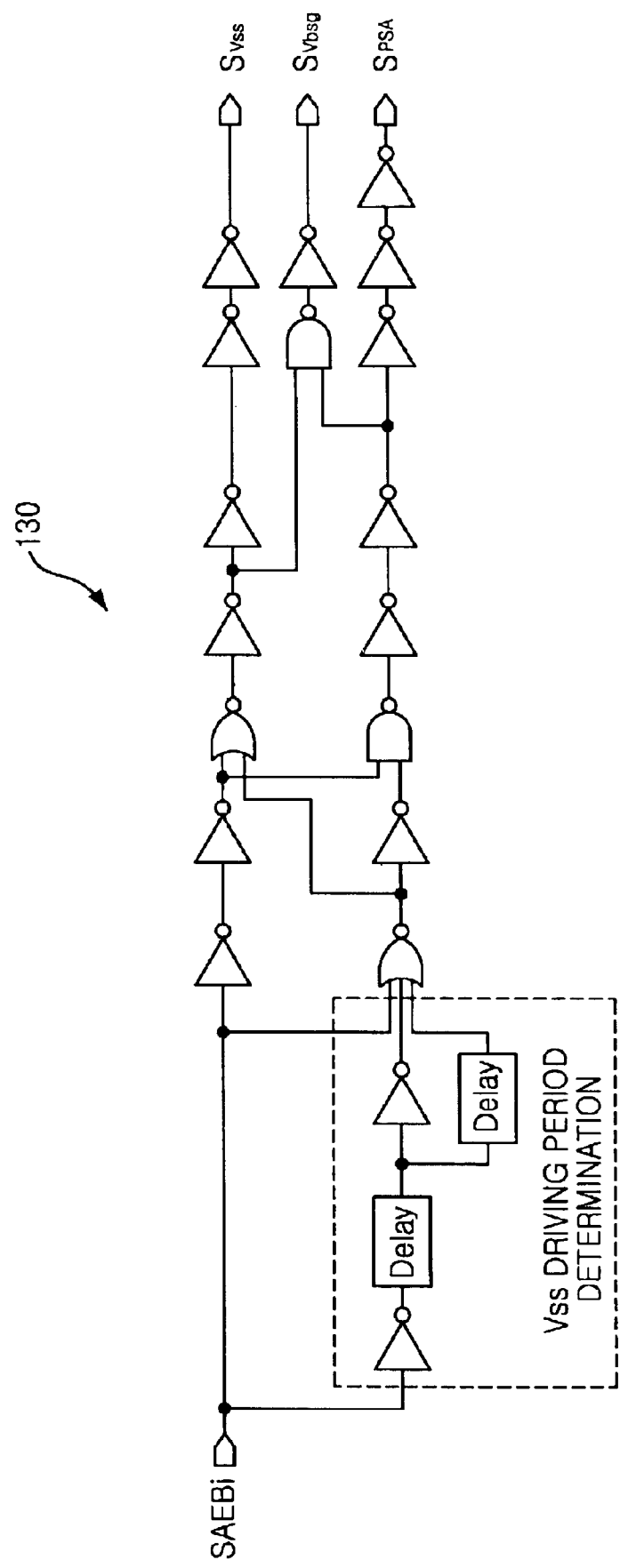
FIG. 2 is a schematic diagram illustrating an essential part of the control unit for controlling a sense amplifier driving unit in the semiconductor memory device in accordance with the present invention.

Referring to FIG. 2, there is shown a schematic diagram illustrating an essential part of the SA driving control unit 130 of the semiconductor memory device in accordance with the present invention.

A sense amplifier enable signal SAEBi inputted to the SA driving control unit 130 passes through a buffering sector consisting of pluarlity logic elements to thereby generate a Vss driving signal $S_{Vss}$, a Vbsg driving signal $S_{Vbsg}$ and a PMOS sense amplifier (PSA) driving signal $S_{PSA}$. The buffering sector includes a delay part so as to set a Vss driving period. At this time, the delay time of the delay part is determined as a time required in driving a voltage level of the bit line up to the boosted ground voltage Vbsg and the delay part is constructed to include a metal option to make the delay time variable.

Figure 3:
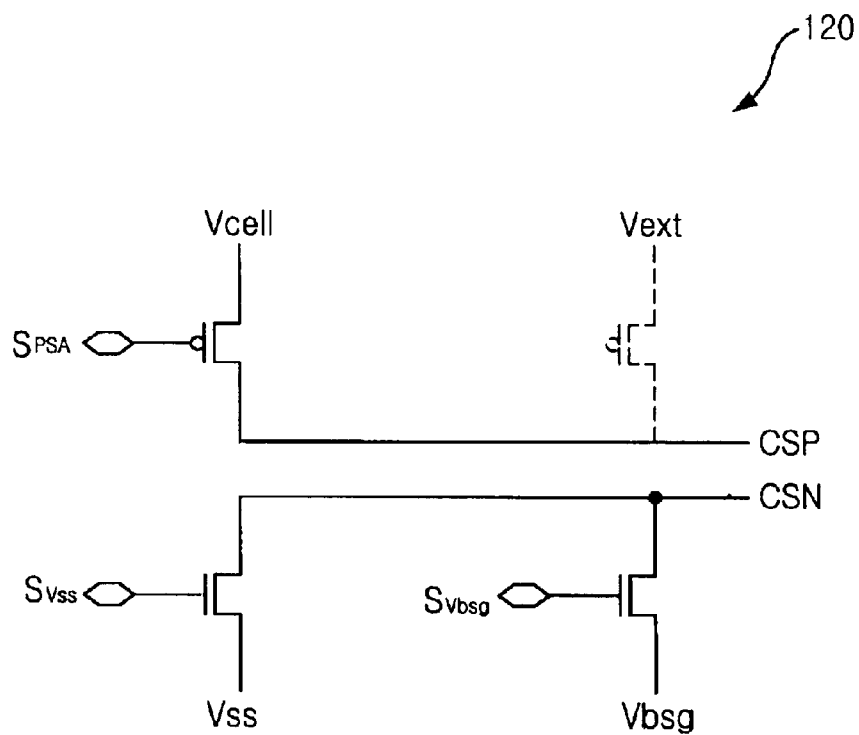
FIG. 3 shows a schematic diagram representing an essential part of the sense amplifier driving unit in the semiconductor memory device in accordance with the present invention.

Referring to FIG. 3, there is described a schematic diagram representing an essential part of the sense amplifier driving unit 120 of the semiconductor memory device in accordance with the present invention.

When driving the sense amplifiers 110 shown in FIG. 1, the SA driving unit 120 supplies a first voltage Vcell to the pull-up source line CSP and sequentially provides the pull-down source line CSN with second and third voltages Vss and Vbsg with the passage of time. In order to provide the first voltage to the pull-up source line CSP of the sense amplifier, the pull-up source line CSP and the first voltage Vcell are connected to a source and a drain of a PMOS transistor, respectively. Moreover, so as to supply the second and the third voltages Vss and Vbsg to the pull-down source line CSN of the sense amplifiers 110, drains of two NMOS transistors are connected in parallel to the pull-down source line CSN of the sense amplifiers 110 and sources of the two NMOS transistors are attached to the second voltage Vss and the third voltage Vbsg, respectively.

Meanwhile, the first voltage Vcell provided to the pull-up source line CSP of the sense amplifiers 110 represents a high data level stored in a cell. In general, an internal supply voltage can be used as the first voltage Vcell but an external supply voltage can also be utilized.

Figure 4A:
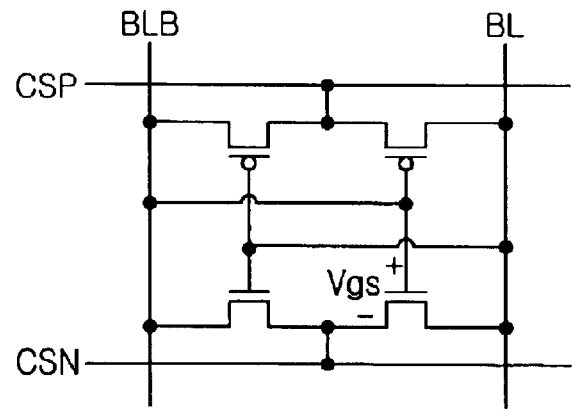
FIG. 4A is a schematic diagram of the sense amplifier of the semiconductor memory device in accordance with the present invention.
Figure 4B:
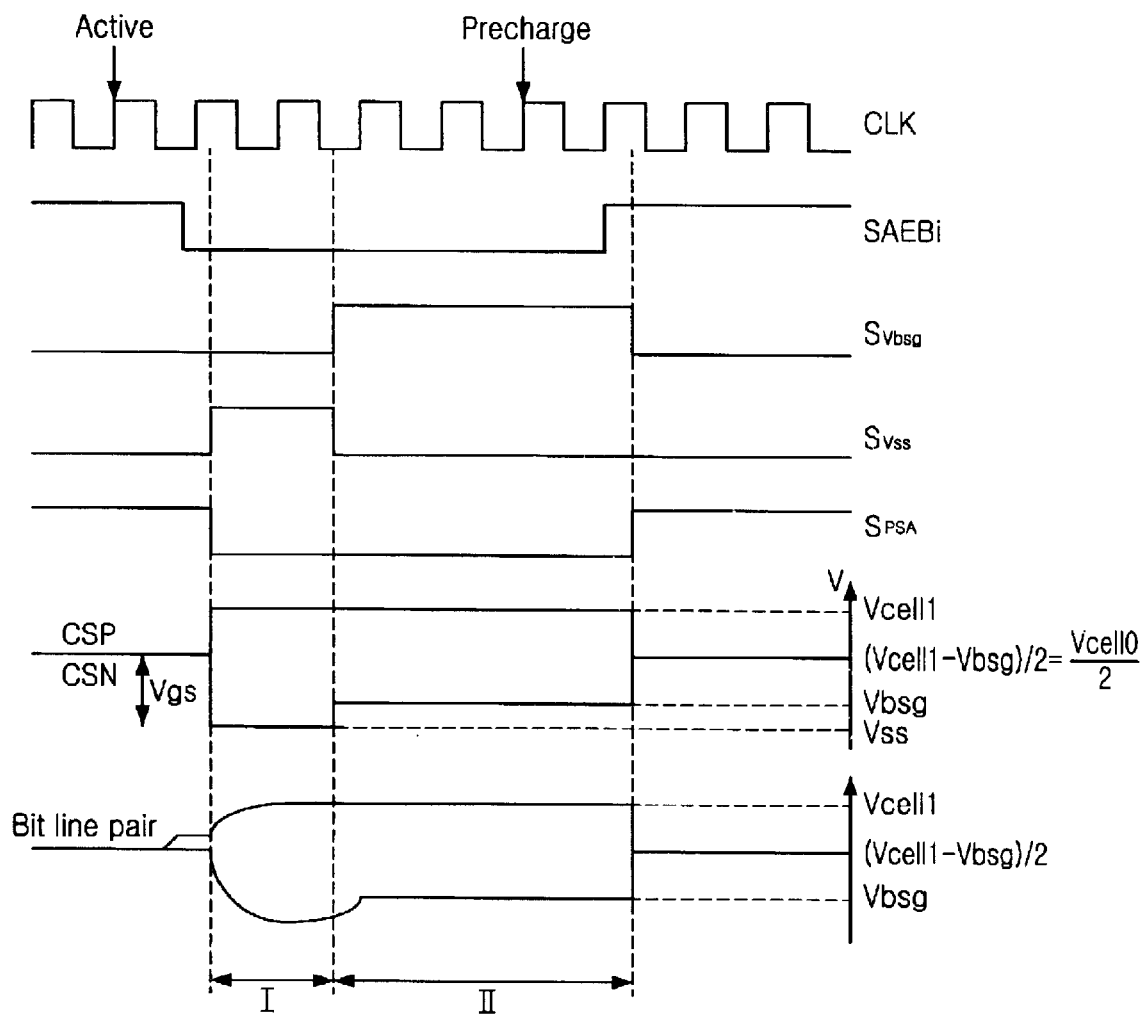
FIG. 4B describes a timing diagram showing active and precharge modes of a sense amplifier in the semiconductor memory device in accordance with the present invention.
Figure 5A:
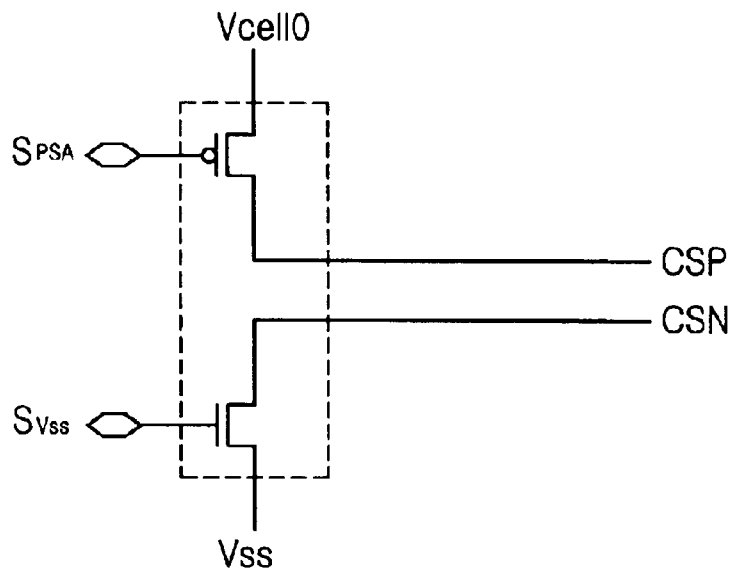
FIG. 5A is a schematic of an essential part of a sense amplifier driving unit in accordance with an example of the prior art.
Figure 5B:
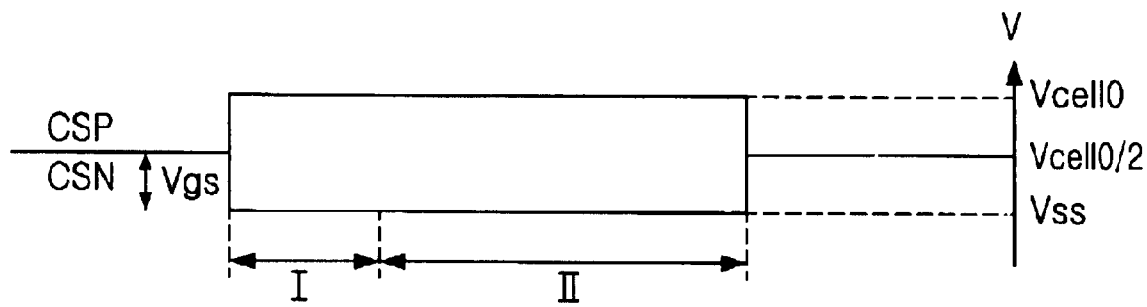
FIG. 5B illustrates a voltage waveform of the sense amplifier driving unit shown in FIG. 5A and a corresponding sense amplifier.
Figure 6A:
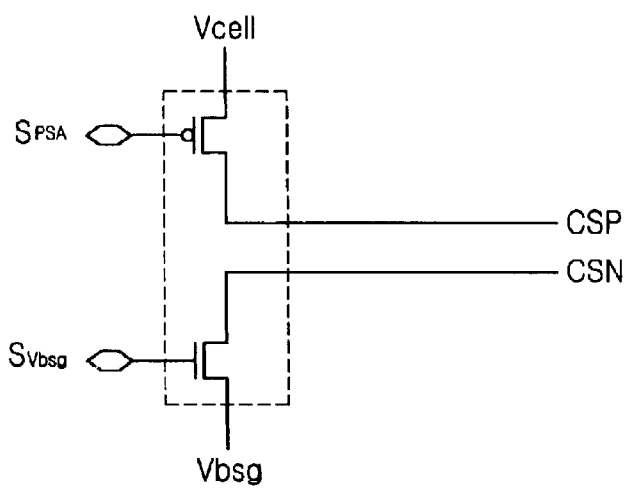
FIG. 6A is a schematic diagram of an essential part of a sense amplifier driving unit in accordance with another example of the prior art, which employs a BSG technology.
Figure 6B:
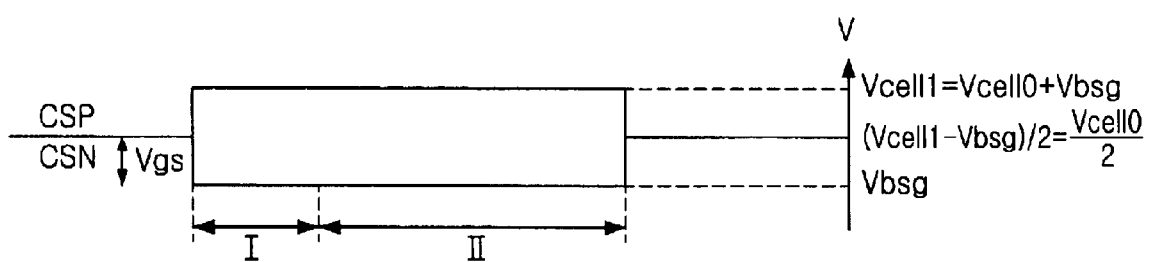
FIG. 6B depicts a voltage waveform of the sense amplifier driving unit shown in FIG. 6A and a corresponding sense amplifier.

Referring to FIGS. 4A and 4B, there are described a configuration of the sense amplifier and a timing diagram showing timing of each signal in active and precharge operations of the sense amplifier of the semiconductor memory device in accordance with the present invention.

If the SA enable signal SAEBi is actuated as a "L" state, the sense amplifier is driven by using the ground voltage Vss as a driving voltage of the pull-down source line CSN of the sense amplifier (I period). Then, after a given time, if a voltage difference between bit lines BL and BLB becomes large, an operation of driving the ground voltage Vss is stopped and the pull-down source line CSN of the sense amplifier is driven by the boosted ground voltage Vbsg (II period).

Hereinafter, there is shown the voltage Vgs provided between the gate and the source of the NMOS transistor that is a pull-down device of the sense amplifier in the I and II periods.

In the I period, $$Vgs = \frac{Vcell1 - Vbsg}{2} + Vbsg \qquad \text{EQ. 3}$$

$$= \frac{Vcell1 + Vbsg}{2}$$

$$= \frac{Vcell0 + 2Vbsg}{2}$$

$$= \frac{Vcell0}{2} + Vbsg$$

In the II period, $$Vgs = \frac{Vcell1 - Vbsg}{2} = \frac{Vcell0}{2} \qquad \text{EQ. 4}$$

That is, the gate-source voltage Vgs of the NMOS transistor can be heightened from $$Vgs = \frac{Vcell1 - Vbsg}{2} = \frac{Vcell0}{2}$$

to $$Vgs = \frac{Vcell1 - Vbsg}{2} + Vbsg$$

to $$Vgs = \frac{Vcell0}{2} + Vbsg$$

by changing the I period driving voltage of the NMOS sense amplifier from the boosted ground voltage Vbsg to the ground voltage Vss.

Furthermore, Vds, which represents drain-source voltage of the NMOS transistor, is heightened in the NMOS sense amplifier in proposition to Vgs.

As illustrated above, in accordance with the present invention, it is possible to improve an operational speed by additionally securing the operational voltage, i.e., the pull-down source line driving voltage, of the sense amplifier and noise caused at a voltage source can be reduced by using an external voltage Vss instead of using an internal voltage such as Vbsg as a driving voltage of the NMOS sense amplifier in the early sensing operation consuming most of current. As a result, the present invention can obtain an improved sensing speed and enhanced stability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a sense amplifier for amplifying memory cell data;
   a sense amplifier driving means for driving a pull-up source line and a pull-down source line of the sense amplifier and sequentially driving the pull-down source line into a ground voltage and a boosted ground voltage in response to a first control signal and a second control signal;
   a sense amplifier driving control means for generating the first control signal and the second control signal and setting a ground voltage driving time of the pull-down source line by adjusting timing of the first control signal; and
   a boosted ground voltage generating means for producing the boosted ground voltage.

2. The semiconductor memory device as recited in claim 1, wherein a point of time when a driving voltage of the sense amplifier is converted from the ground voltage to the boosted ground voltage is a moment when a voltage of one bit line connected to the sense amplifier becomes lower than the boosted ground voltage.

3. The semiconductor memory device as recited in claim 1, wherein the sense amplifier driving control means generates a ground voltage driving signal, a boosted ground voltage driving signal and a PMOS sense amplifier driving signal when a sense amplifier enable signal is inputted thereto and passes through a buffering sector having a plurality of logic elements, said buffering sector including a delay part so as to set a ground voltage driving period.

4. The semiconductor memory device as recited in claim 3, wherein a time of a bit line being driven to the boosted ground voltage is determined according to a delay time of the delay part.

5. The semiconductor memory device as recited in claim 3, wherein the delay part includes a metal option therein.

6. A semiconductor memory device comprising:
   a sense amplifier for amplifying memory cell data;
   a sense amplifier driving means having a first sense amplifier driving line connected to a cell voltage providing sector, and a second sense amplifier driving line attached to a ground voltage providing sector and a boosted ground voltage providing sector in parallel;
   a sense amplifier driving control means for controlling the cell voltage providing sector, the ground voltage providing sector and the boosted ground voltage providing sector; and
   a boosted ground voltage generating means for producing a boosted ground voltage to thereby provide the boosted ground voltage to the sense amplifier driving means.

7. The semiconductor memory device according to claim 6, wherein the ground voltage and the boosted ground voltage are sequentially supplied to the sense amplifier.

8. The semiconductor memory device according to claim 7, wherein a point of time when a driving voltage of the sense amplifier is converted from a ground voltage to the boosted ground voltage is a moment when a voltage of one bit line connected to the sense amplifier becomes lower than the boosted ground voltage.

9. The semiconductor memory device according to claim 6, wherein the sense amplifier driving control means generates a ground voltage driving signal, a boosted ground voltage driving signal and a PMOS sense amplifier driving signal when a sense amplifier enable signal is inputted thereto and passes through a buffering sector having a multiplicity of logic elements, said buffering sector including a delay part so as to set a ground voltage driving period.

10. The semiconductor memory device according to claim 9, wherein a time of a bit line being driven to the boosted ground voltage is determined according to a delay time of the delay part.

11. The semiconductor memory device according to claim 9, wherein the delay part includes a metal option therein.

12. A method for driving a sense amplifier including a pull-up source line and a pull-down source line, which comprises steps of:
   (a) initially driving the pull-down source line to a ground voltage; and
   (b) driving the pull-down source line to a boosted ground voltage after performing the step (a), wherein the pull-down source line is driven by a cell voltage.

* * * * *